(12) United States Patent
Bowen et al.

(10) Patent No.: US 7,319,946 B2
(45) Date of Patent: Jan. 15, 2008

(54) METHOD FOR ON-CHIP SIGNAL INTEGRITY AND NOISE VERIFICATION USING FREQUENCY DEPENDENT RLC EXTRACTION AND MODELING TECHNIQUES

(75) Inventors: Michael A. Bowen, Wallkill, NY (US); Alina Deutsch, Chappaqua, NY (US); Gerard V. Kopcsay, Yorktown Heights, NY (US); Byron L. Krauter, Leander, TX (US); Barry J. Rubin, Croton-on-Hudson, NY (US); Howard H. Smith, Beacon, NY (US); David J. Widiger, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 390 days.

(21) Appl. No.: 10/274,861

(22) Filed: Oct. 21, 2002

(65) Prior Publication Data

US 2004/0078176 A1   Apr. 22, 2004

(51) Int. Cl.
*G06F 17/50* (2006.01)
*G06G 7/62* (2006.01)
*G06G 7/48* (2006.01)

(52) U.S. Cl. ............................ 703/13; 703/14; 703/18; 703/3

(58) Field of Classification Search ................ 703/3–5, 703/13–15
See application file for complete search history.

(56) References Cited

U.S. PATENT DOCUMENTS

| | | | | |
|---|---|---|---|---|
| 5,629,860 A | * | 5/1997 | Jones et al. ..................... | 716/6 |
| 5,761,076 A | * | 6/1998 | Miki ............................. | 716/5 |
| 5,894,220 A | * | 4/1999 | Wellstood et al. ........... | 324/248 |
| 6,061,508 A | * | 5/2000 | Mehrotra et al. .............. | 716/6 |
| 6,086,238 A | * | 7/2000 | Mehrotra et al. ............. | 716/10 |
| 6,317,859 B1 | * | 11/2001 | Papadopoulou ................ | 716/4 |
| 6,342,823 B1 | * | 1/2002 | Dansky et al. ................. | 333/1 |
| 6,418,401 B1 | | 7/2002 | Dansky et al. ................ | 703/27 |
| 6,865,727 B2 | * | 3/2005 | Frerichs et al. ............... | 716/19 |
| 2002/0144224 A1 | * | 10/2002 | Frerichs et al. ................ | 716/4 |

* cited by examiner

*Primary Examiner*—Kamini Shah
*Assistant Examiner*—David Silver
(74) *Attorney, Agent, or Firm*—Lynn L. Augspurger

(57) ABSTRACT

New Frequency dependent RLC extraction and modeling for on chip integrity and noise verification employs:
  A) 2D scan line algorithm for the collection of adjacent signal and power conductor coordinates;
  B) In core pair-wise frequency Dependent RL extraction;
  C) In core equivalent circuit synthesis;
  D) caching and partitioning RL extraction techniques for run time efficiency; and
  E) Techniques for synthesizing stable circuits to represent frequency dependent RL circuits for non-mono tonic $R_{12}$.

5 Claims, 4 Drawing Sheets

Example of 2D Scan line and Pairwise extraction

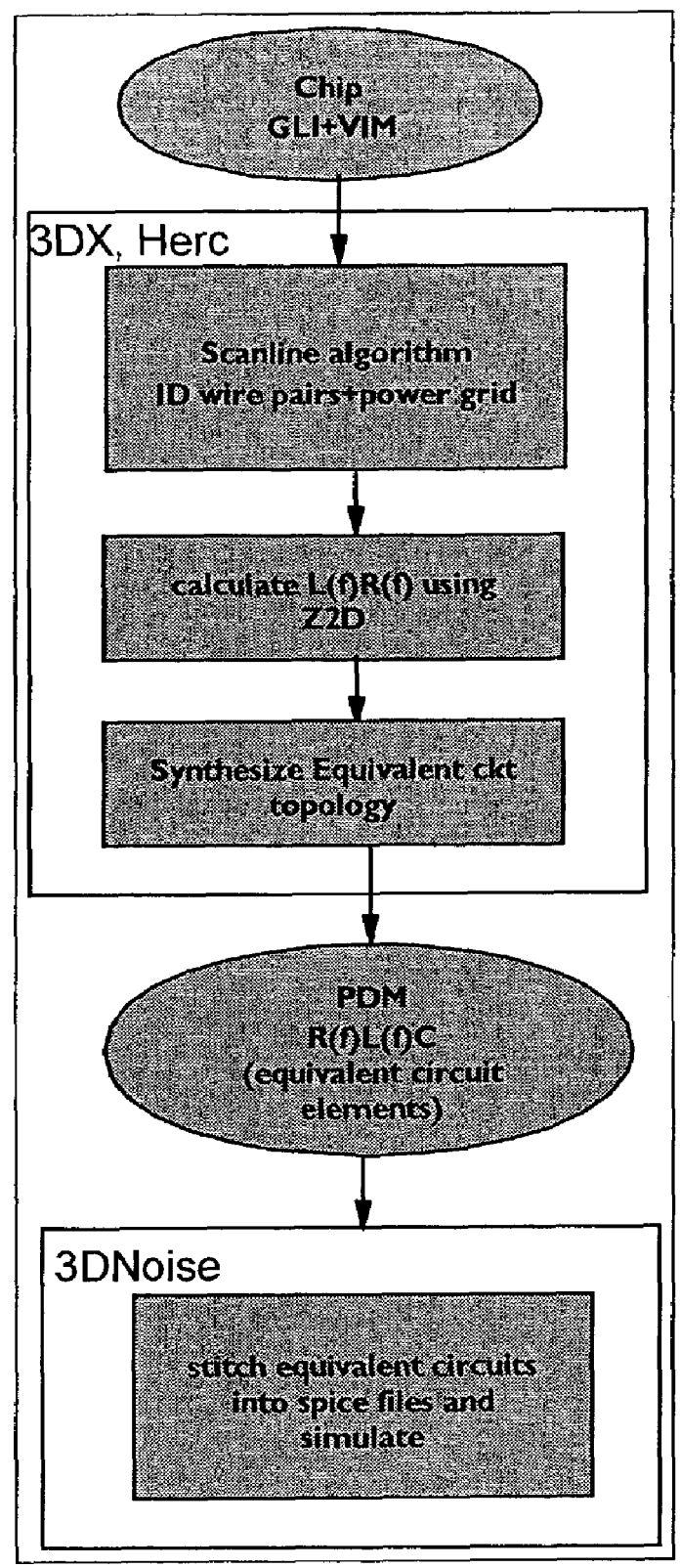
Figure 1. Methodology flow

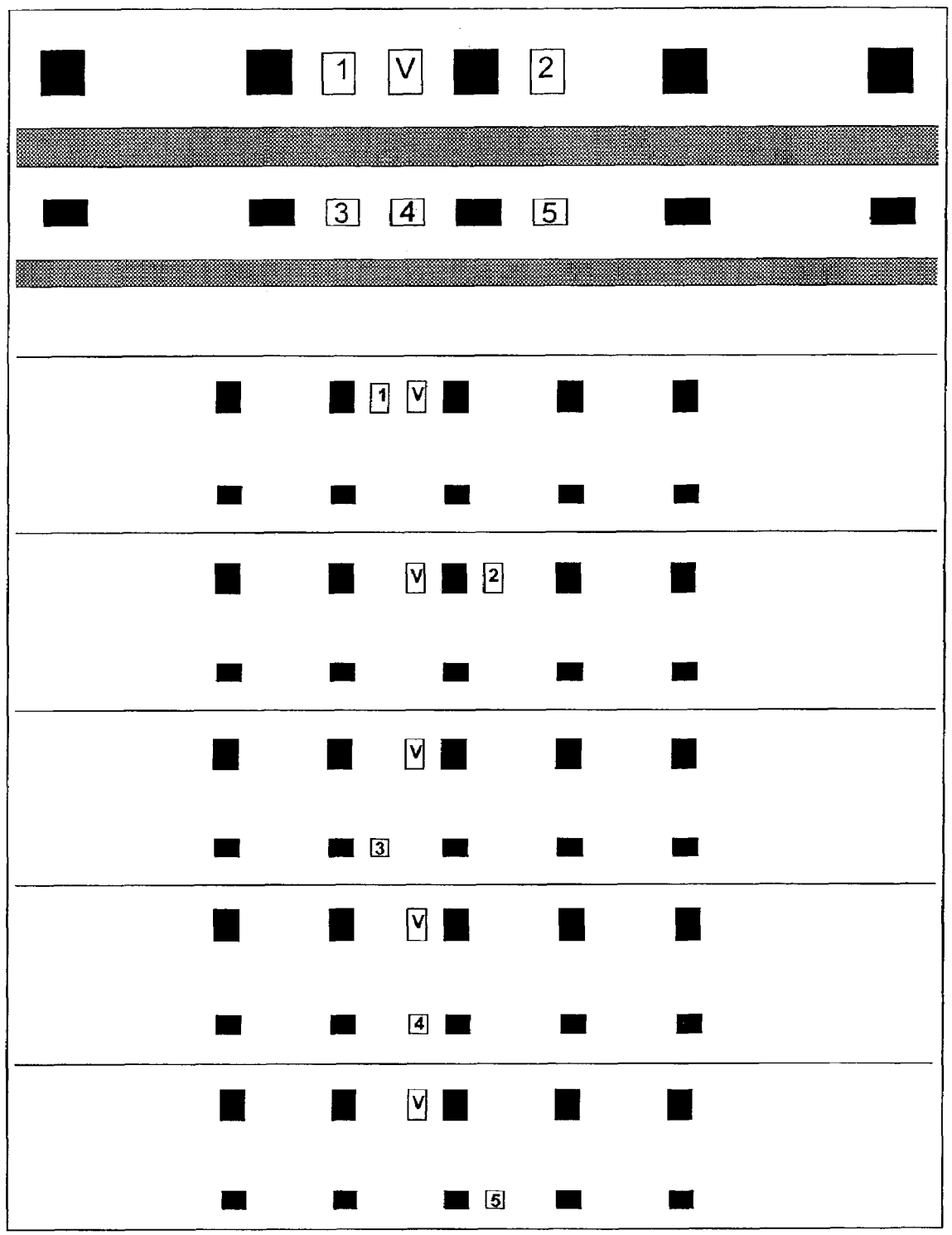
FIGURE 2. Example of 2D Scan line and Pairwise extraction

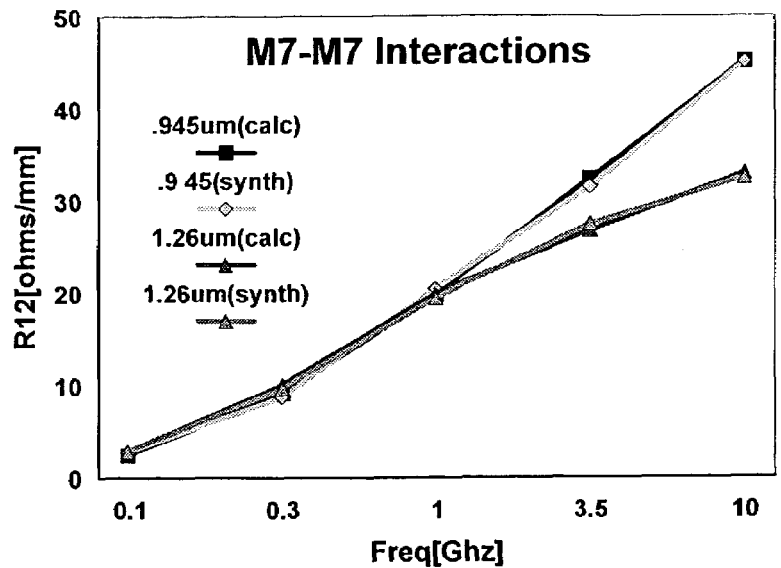
FIGURE 3. 2D RL extraction for the determination of $R_{12}$
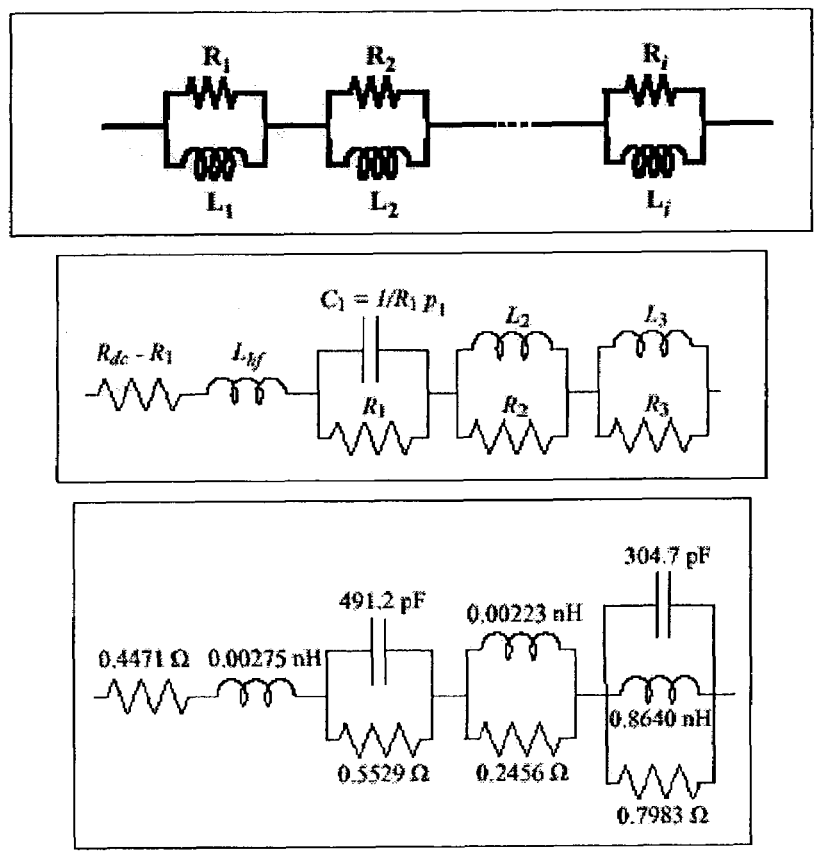
FIGURE 4. Equivalent Circuit Forms for the Representation of frequency dependent RL

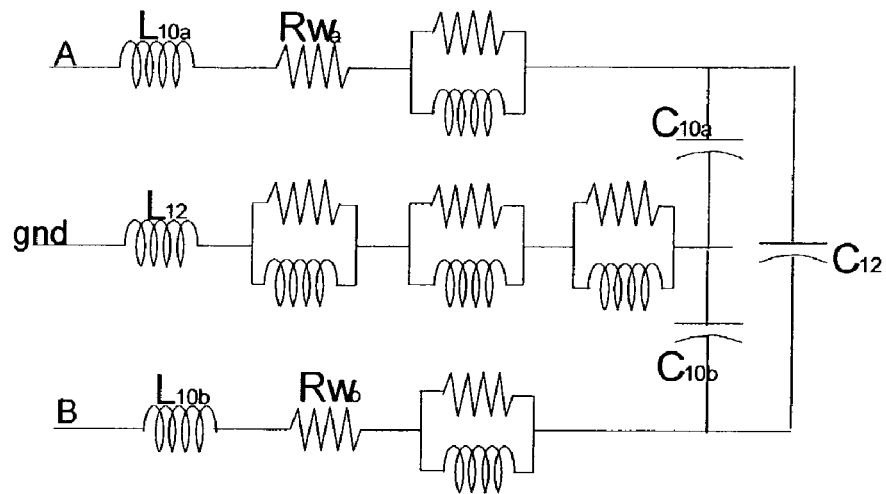
FIGURE 5. Nport Circuit form
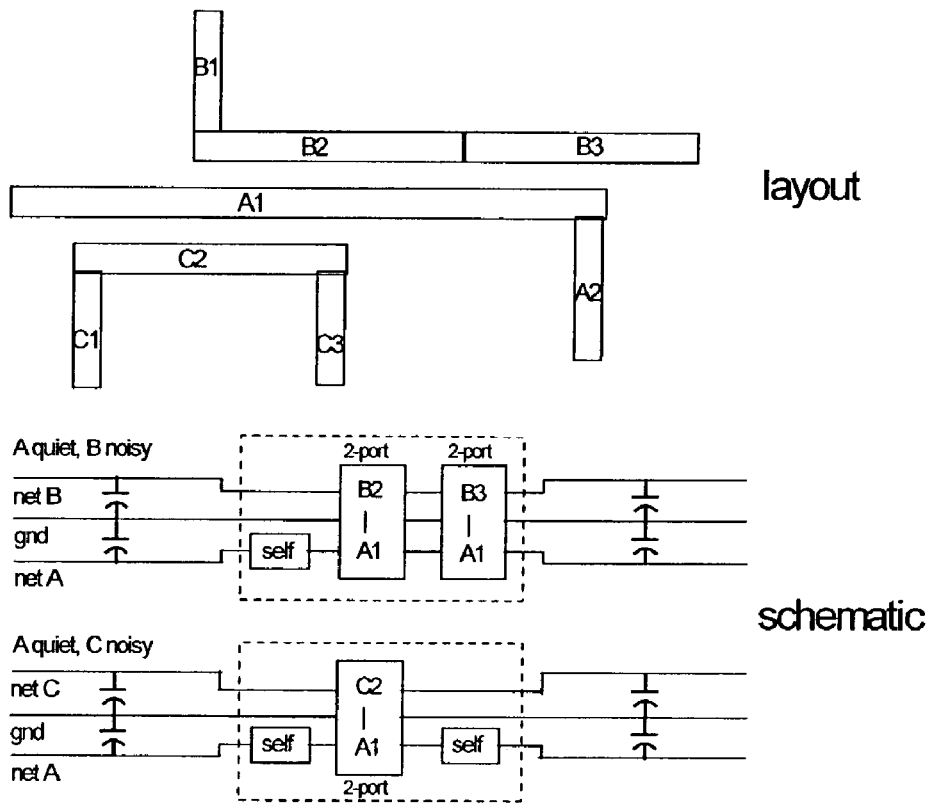
FIGURE 6. Example of shapes layout to schematic build using nports

METHOD FOR ON-CHIP SIGNAL INTEGRITY AND NOISE VERIFICATION USING FREQUENCY DEPENDENT RLC EXTRACTION AND MODELING TECHNIQUES

FIELD OF THE INVENTION

This invention relates to an on-chip frequency dependent RLC environmental extraction process and to simulation techniques for the evaluation of coupling noise and signal integrity.

Trademarks: IBM® is a registered trademark of International Business Machines Corporation, Armonk, N.Y., U.S.A. Other names may be registered trademarks or product names of International Business Machines Corporation or other companies.

BACKGROUND

IBM's research into the evaluation of coupling noise and signal integrity has enhanced the advances in silicon CMOS technologies. But, both wire density and circuit speed have increased to the point that signal integrity, in particular the coupling noise of the on-chip interconnect has become a significant issue with respect to chip functionality, performance and reliability. The IBM research has been illustrated in the patent literature, illustrated by U.S. Pat. No. 6,342,832, issued Jan. 29, 2002, entitled: System and Method for Reducing Calculation Complexity of Lossy, Frequency-Dependent Transmission-Line Computation with Allan Dansky, Alina Deutsch, Gerard Kopcsay, Phillip Restle, and Howard Smith, named inventors; U.S. Pat. No. 6,418,401, issued Jul. 9, 2002, entitled: Efficient Method of Modeling Three-Dimensional Interconnect Structures for Frequency-Dependent Crosstalk Simulation, naming Allan Dansky, Alina Deutsch, Gerard Kopcsay, Phillip Restle, and Howard Smith, inventors; U.S. Pat. No. 6,086,238. Jul. 11, 2000, entitled:. Method and System for Shape Processing within an Integrated Circuit Layout for Parasitic Capacitance Estimation, naming Sharad Mehrotra, Paul Gerard Villarrubia, and David James Widiger, inventors; and U.S. Pat. No. 6,523,149, issued Feb. 18, 2003, based upon U.S. Ser. No. patent application No. 09/666,272, filed Sep. 21, 2000, entitled: METHOD AND SYSTEM TO IMPROVE NOISE ANALYSIS PERFORMANCE OF ELECTRICAL CIRCUITS, naming David Widiger, Mark Wenning, and Sharad Mehrotra, as inventors.

As background for the discussion of our improvements, we refer to the following evaluation methodologies which have been developed:

Referring to the above evaluations, we note that (1) shows a verification methodology that has been developed to assure appropriate noise levels are maintained within apportioned limits to allow evaluation of all global level nets within a chip hierarchy. Such techniques employee coupled RC extraction due to the premise that capacitive coupling is the primary noise injection mechanism. However, we have found that there exists conditions where some nets could experience both capacitive and inductive coupling or inductive coupling only. There are approximate conditions in which the RC modeling of the coupled noise yields greater than 25% error in the amplitude calculation conditions set forth above as (1), (2),(3) and (4).

$$\text{Rwire\_perp} < 30 \text{ ohms/mm} \qquad (1)$$

$$\text{Rwire\_vict} < 60 \text{ ohms/mm} \qquad (2)$$

$$\text{Rwire\_perp} * Lc / 2 * Zo < 1.5 \qquad (3)$$

$$\text{Zdrv} < 1.5 * Zo \qquad (4)$$

These conditions readily exist on high performance ASICs and microprocessor designs. It should be pointed out that all conditions, (1-4), should exist to experience inductive behavior. However in cases where one of the conditions was "significantly" satisfied the other condition need not be satisfied in order to experience inductive behavior. In Actual practice the error can be significantly higher when considering net topology. Hardware failures as well as research in this area have deduced the presence of such an effect and the limitation of current signal integrity practices which employee only RC models.

SUMMARY OF THE INVENTION

To solve this problem, a method has been developed to provide full on-chip coupled noise verification capabilities employing frequency dependent RLC extraction and simulation techniques.

To illustrate our invention, it is shown for three areas of calculation in FIG. 1. These areas are:
1) RLC extraction
2) Equivalent circuit build
3) Simulation approach The RL extraction process employs a 2-D scan line algorithm which is used to determine the coordinates position of all return path conductors coordinates both voltage and ground in a radius determined by a user defined parameter for power radius. In addition to power conductors, adjacent signal conductors within a user specified signal radius are also located. The scan line algorithm operates on all planes where parallel wiring with respect to the target net exists i.e. 2D approximation.

For each pair-wise adjacencies within the signal radius a 2D RL field solver process is performed at several frequency points. The field solver outputs $L_{11}$, $L_{12}$, $L_{22}$, $R_{11}$, $R_{12}$, $R_{22}$ for each frequency as shown in FIG. 2. 3D capacitance extraction is computed independently using standard disclosed solutions(Ref 3DX).

Since the RL parameters are frequency dependent and it is desired to perform time domain simulations for the determination of the coupling noise amplitude and pulse width, a synthesis scheme is developed which exploits the circuit form as described our prior U.S. Pat. Nos. 6,342,823 and 6,418,401 referenced above. In our invention, the disclosed circuit forms additional forms are characterized and optimized for application of far coupling interactions where the $R_{12}$ is not monotonically increasing.

Circuit simulation are performed in a pair-wise manner. That is for each aggressor net which has defined coupling interactions with respect to the victim net, a complete RLC model is built for both nets including coupling capacitance and nports from source to sink pins. If a victim net has N aggressor nets, N pair wise networks are formulated for simulation. These simulations can be performed using standard fast simulation techniques like RICE4 to assist in commercial implementation.

DESCRIPTION OF THE DRAWINGS

FIG. 1 show the overview flow of our method.

FIG. 2 illustrates the application of a 2D Scanline and pairwise extraction for the Conductor X-section, and FIG. 3 shows the 2D RL Extraction Results.

FIG. 4 sets forth equivalent circuit forms; and

FIG. 5 shows a Nport circuit form; while

FIG. 6 illustrates pair wise coupling using Nports.

DETAILED DESCRIPTION OF THE INVENTION

Thuring now to the details of our method, we employ the following procedures in our preferred embodiment:
1) signal and return conductor shapes collection using a 2D Scanline;
2) 2D RL extraction at several frequency points; and
3) equivalent circuit build using circuit synthesis techniques;
4) caching data for extraction speed-up; and the
5) application of nports for noise simulations.

The purpose of the scanline during extraction is to provide an efficient mechanism for collecting design shapes within proximity of each other. Scanline techniques have been described in the above referenced patent entitled: METHOD AND SYSTEM TO IMPROVE NOISE ANALYSIS PERFORMANCE OF ELECTRICAL CIRCUITS, naming David Widiger, Mark Wenning, and Sharad Mehrotra, as inventors for capacitance extraction. The scanline process consists of moving an imaginary "scan line" from one side of a chip design to the other. For reference here, the scanline is taken to be a vertical line moving from left to right, though it may be oriented in an arbitrary way. For any given location of the scanline, the design shapes which it intersects are used in the extraction process. While the scanline is at a particular position, the shapes which it intersects are scanned by "moving" along the scan line. For reference purposes here, the scan will be from the bottom of the scanline to the top, though any scan mechanism can be used with this process.

We describe here a scanline process which works well with inductance extraction. Since inductive interaction between design shapes is dominant only for long, parallel runs between two such shapes, we consider only shapes whose length is perpendicular to the scanline. We then consider all shapes by scanning both in the x direction and the y direction, each scan considering only the shapes whose length is perpendicular to the scanline. We describe only one of these two analyses below. The other is identical, but with the scan in a different direction. When the two processes are completed, the data can be combined into a single organization.

As the scanline is moved from left to right, it will stop at critical places for analysis to be done. These places are referred to as "scan stops". Such places are chosen as those scanline positions where any shape perpendicular to the scanline either starts or stops. In-between these so-defined scan stops, the shapes are unchanged and analysis at these places is unnecessary.

For each position of the scanline, all shapes intersecting the scanline are considered. If inductance extraction is desired for that shape, its neighboring shapes are examined using the scanline facilities of "moving" up and down the scanline. Once the desired shapes are collected, a numerical analysis is performed to determine inductance data for both self inductance and coupled inductance to possibly several other shapes.

Described now is the process of collecting neighboring shapes to include in the numerical analysis. A sufficient number of neighboring power shapes are to be collected to provide an accurate extraction, but not to be excessive and cause poor performance. In the following, the shape for which inductance is being extracted is referred to as the target shape. Neighboring shapes are referred to as "signal" shapes or "power" shapes, depending on the use of the shape in its containing circuit. The concept of power bays is employed in this process. Power bays are defined as regions along the scanline delimited by major ground or power shapes, typically shapes of a regular pattern on higher-level layers of metal. With this process, neighboring shapes are collected based either on the distance to the target shape, or also depending on the power bay it is in, the choice which may be made by the user. The power bays to be considered can be chosen as simply so many on either side of the power bay containing the target shape, or an indeterminate number of bays on each side, enough bays being considered on each side of the bay of the target shape so as to include a "radius" distance from the bay containing the target shape. This radius distance may be supplied by the user. The selection process may be different when considering neighboring power shapes, and when considering other signal shapes to which coupling will be considered.

The user defined return path radius is selected based on the requirement that the composite return resistance at low frequency is a small fraction of the expected signal wire resistance. This has been shown through circuit simulation to be 10% or less[2-4]. An obvious enhancement to the user define radius definition is to calculate the return resistance during the scanline process such that 10% of signal wire resistance(or less) rule can be implicitly satisfied The advantage of the use of the power bay approach is two-fold. The inductive interaction generally changes abruptly at major ground or power wires; thus, if one wire in a bay is to be considered, most likely all the wires in a bay must be considered. Also, the use of a bay approach for collecting return wires offers more repeated cases for analysis which improves performance by providing a more efficient mechanism for caching inductance analysis results for reuse.

In the general case, the inductance extraction can include any number of signal shapes. Much of the procedure described here can be used in such a situation. The description here is focused, however, on the pair-wise approach, where at most only two signal shapes are considered. In this case an analysis is repeated for each possible signal neighbor for which coupled inductance is to be extracted. The use of a pair-wise approach improves performance and for most cases has acceptably small error.

The process described here uses a finite-frequency, two-dimensional inductance solver. The inductance information is determined by the above solver for several frequencies. These frequencies may be supplied by the user or may be synthesized by the tool based on the various design features. Such an analysis may be done considering only the target shape in the presence of neighboring return shapes, or may be done considering the target shape and one neighboring signal shape in the presence of neighboring return shapes. In the former case, each frequency-point analysis will return a complex impedance which consists of two values, a real part and an imaginary part. In the latter case, each frequency-point analysis will return three complex impedances each again consisting of a real part and imaginary part. The three complex impedances represent the self inductance of each signal wire and the coupling inductance between them.

Once a set of results over several frequency points is obtained, a circuit model is synthesized to represent the result for time domain simulation. The circuit used is based on the topologies shown in FIG. 4 (for self inductance and coupled inductance respectively). The component values are based on the fitting procedure described later.

Under normal processing long shapes are split into shorter shapes so that the ensuing circuit model will more accurately represent distributed effects. For the process described here, such splits of parallel wires are chosen so that they occur at the same scanline position. This improves the efficiency of the scanline algorithm.

In the process described here, the results of the inductive analysis are cached for retrieval if the same calculation is needed at a different place in the design. The entity that is cached is the set of inductance results over the set of frequencies. Each coupled inductance result is considered a separate entity from each other of the same target and the self inductance result of that target. Each result is stored in a hash-like table whose key is the set of signal and power shape cross-section used to reach that result. The ability to save this information to file to be used in a subsequent extraction may be provided.

Circuit Synthesis

The general problem of circuit synthesis to represent frequency dependence in time domain simulation is discussed in terms of approximating a complex impedance function by a ratio of polynomials. Thus given a set of known (pre-calculated or measured) complex impedances $Z_i$ at frequencies $z_i$ we wish to find an approximate representation $$Z(s_i) = \frac{N(s_i)}{D(s_i)}$$

(where $s=j\omega$) with a finite number of poles.

One application for this fitting procedure is to represent the frequency dependent series impedance of a transmission line. The resulting approximate impedance function can then be used to create $$Z(\omega)=R(\omega)+j\omega L(\omega)$$

a segmented model of a lossy, frequency dependent transmission line. Since the series impedance per unit length of a transmission line is of the form $$Z_s(\omega)=R(\omega)+j\omega L(\omega)=R_{dc}j\omega L_\infty+R_s(\omega)+j\omega L_s(\omega)$$

we can subtract out the dc resistance and high frequency inductance before finding an approximation Several approaches have been employed to find a set of poles and residues that provide a good fit to the series impedance of various transmission lines. The impedance function for the Foster RL network shown in FIG. 4 can be represented mathematically as $$Z(s) \equiv \sum_{k=1}^{n} \frac{R_k s}{s + p_k}$$

where the $p_k=R_k/L_k$

The impedance function for the foster Rl network is solved using frequency domain Prony or cauchy procedure which result in the following matrix representation $$\begin{bmatrix} \frac{(\omega_1/p_1)^2}{1+(\omega_1/p_1)^2} & \frac{(\omega_1/p_2)^2}{1+(\omega_1/p_2)^2} & \cdots & \frac{(\omega_1/p_n)^2}{1+(\omega_1/p_n)^2} \\ \vdots & \vdots & \vdots & \vdots \\ \frac{(\omega_i/p_1)^2}{1+(\omega_i/p_1)^2} & \frac{(\omega_i/p_2)^2}{1+(\omega_i/p_2)^2} & \cdots & \frac{(\omega_i/p_n)^2}{1+(\omega_i/p_n)^2} \\ \frac{(\omega_1/p_1)}{1+(\omega_1/p_1)^2} & \frac{(\omega_1/p_2)}{1+(\omega_1/p_2)^2} & \cdots & \frac{(\omega_1/p_n)}{1+(\omega_1/p_n)^2} \\ \vdots & \vdots & \vdots & \vdots \\ \frac{(\omega_i/p_1)}{1+(\omega_i/p_1)^2} & \frac{(\omega_i/p_2)}{1+(\omega_i/p_2)^2} & \cdots & \frac{(\omega_i/p_n)}{1+(\omega_i/p_n)^2} \end{bmatrix} \begin{bmatrix} R_1 \\ R_2 \\ \vdots \\ R_n \end{bmatrix} = \begin{bmatrix} R(\omega_1) \\ \vdots \\ R(\omega_i) \\ \omega_1 L(\omega_1) \\ \vdots \\ \omega_i L(\omega_i) \end{bmatrix}$$

Note that the above set of matrix equations uses both the given resistance and inductance information to determine the best fit. Since the networks are causal, it is really only necessary to fit one or the other, assuming the fit is accurate over a broad enough frequency range.

In practice it is often found that the first half of the above set of equations for fitting the resistance is sufficient to also obtain a reasonable fit to the inductance. However, in general the full set of equations as given above provides a better overall fit.

The procedure outlined above has the advantage that the fit is determined only by real poles. Assuming these real poles are in the left half of the complex plane and that the circuit elements are realizable, then the resulting network is guaranteed to be passive and stable. Any non-physical, right half plane poles in the solution (possibly due to noise in the measured or calculated input data), are easily identified, and can be eliminated, usually without significantly degrading the accuracy of the fit.

This network also has a particularly simple form which is useful for implementing a discretized equivalent circuit model of the transmission line in a standard circuit solver. Of course, the solution can fail if the chosen network topology is not appropriate to the given data. For example, the Foster RL network used here can never accurately fit a resistance which decreases with frequency For such cases other circuit forms such as an RC and RLC forms as shown in FIGS. 4*b* and 4*c* allow the modeling of decreasing or resonant resistance responses. The solutions for the determination of circuit element values follow similar procedures as discussed for the foster network.

Circuit Simulation

This process includes the rendering of the extracted results in a circuit suitable for simulation of noise or timing delay. Timing delay simulation will require only the self inductance data while the noise simulation will require both the self and the coupled inductance data. For a given target net, each circuit built for timing or for the pairwise interaction between to signals may be different since some shapes may couple to one neighbor net and others to another. For example, if the interaction of the target net with perpetrator net A was being considered, and a shape on the target net had inductive coupling only to a different perpetrator net B, that shape in the pairwise circuit modeling the target coupling to A would be represented by a self inductance model. If later the interaction with net B were to be considered, that shape would be represented by a coupled inductance model.

To account for the above, this process includes building a circuit model containing what will be referred to as "nport"s, FIG. 5. Each nport coincides with a shape for which inductance was calculated, and contains the self inductance data and the coupled inductance data for each neighbor signal shape considered. Each nport will have a pair of terminals for the target shape and a pair for each perpetrator shape.

It is possible for a target shape to have more than one coupling to a neighboring signal shape. This can occur if the return wire structure changes somewhere along the parallel lengths of the two signal shapes. In such a case, the process allows multiple nport terminal pairs for the one shape. Similarly, there may be more than one neighbor shape belonging to the same net, both coupling to the same target shape. Again, the process allows multiple nport terminal pairs representing multiple neighbor shapes of the same net.

For this process, a convention will be used to label the terminals of a port as left and right, and have these coincide consistently with the ends of the shape represented by the nport. For clarity the left end of horizontal wires or the bottom end of vertical wires will correspond to the left terminal of the nport terminal pair, though any consistent convention will be sufficient. By following such a convention, this process insures that the directionality between the two shapes, important for coupled inductance, is preserved in the subsequent circuit model.

For this process, the length of the target shape is attached to the nport. Attached to each perpetrator port (terminal pair) is the length of the corresponding perpetrator shape and its relative alignment with the target shape. This permits proper apportioning of the target shape to self inductance and coupled inductance in the subsequent circuit model.

The process of constructing the circuit for simulating noise or timing delay based on RC extraction generally uses a "tee" model approach; that is, each shape is represented as two resistors, each resistor representing the resistance of half the shape, and all capacitances to ground or to other signal shapes are connected to the node where the two resistors join. This tee-model choice is for circuit efficiency, since there are typically more than two capacitors attached to a shape. This process, however, uses a "pi" model when representing the inductance, either self or coupled. The pi model consists of a single inductance model (corresponding to a single resistor in the RC case), and each capacitor is now split into two, each half-capacitor attached to either side of the inductance model. This also results in circuit efficiency since the inductance model would have to be split into two halves if the tee model were used; it is generally more efficient to split the capacitors in such a case, which is done with the pi model. The process would use tee models for non-inductance shapes and pi models for inductance shapes.

An example of an inductance model reconstruction is shown in FIG. 6. Here, the pairwise interaction between net A (the victim) and net B (the aggressor) is considered first. The model representing the inductive interaction consists of three pieces: a self-inductance piece for where shape Al does not couple to any shape in net B, a piece where A1 couples with shape B2, and a piece where A1 couples with shape B3. In the pairwise case of net A interacting with net C, however, the model is different. It consists again of three pieces: the first and third pieces are self-inductance models for the portion of Al that does not couple to any shape in net C, and the second piece where Al couples to C2.

The general process of constructing the circuit representing the noise coupling problem would consist of replacing each shape with the appropriate model, either the tee model for non-inductance, or the pi model for inductance, where the construction of the inductance model would consist of possibly several segments depending on the alignment of the coupled shape with the target shape. Sufficient information would accompany each nport so that the shape or shapes corresponding to a coupled net could be resolved. The two nets would then both have nport data representing their coupling. In this process, one would be arbitrarily chosen. For reference here, that of the victim net is chosen.

The use of the coupled inductance model of FIG. 5 necessitates that a "cut point" exist through the model; that is, there should be no connection between the left and right sides of the model other than through the model itself. This process insures that such is the case by including the notion of ground regions. A ground region consists of nodes on the net which share a common ground node. The nodes of a typical RC network would constitute a single ground region. The two sides of the inductance model of FIG. 5 would constitute different ground regions. This process includes the careful placement of net-to-net coupling capacitors so that they always couple nodes in the same ground region and thus not violate the cut point restriction of the inductance model.

This process also takes into account the nature of inductive noise to have possible noise in either the positive or negative directions from a positive-going stimulus. To this end, the process is to switch each perpetrator noise source in both directions and choose whichever is the worst noise at the victim net sinks. Such a choice does not have to be made until the nature of other noise sources is known. The process of simulating coupled noise in RC circuits is described in (ref to 3 dnoise patent).

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method for evaluation of coupling noise and signal integrity of wiring on a chip with on-chip coupled noise verification using frequency dependent RLC extraction and simulation modeling comprising the steps of:

performing an RL extraction process which employs a two dimensional (2-D) scan line algorithm which is used to determine coordinates of return path conductors' power and signal shapes whose length is perpendicular to the scan line by scanning both in the x and y direction for both voltage and ground in a radius on said chip determined by a user defined parameter for a power shape radius;

within a user determined signal radius on said scan line locating adjacent signal conductors; and employing a scan line two dimensional (2-D) approximation of conductor shapes for parallel wiring for all planes where parallel wiring with respect to a target net exists for said determined return path conductors and said signal conductors; and wherein for pair adjacencies within said signal radious a two dimensional (2D) RL field solver resistance inductive calculation is performed using resistance and induction information to determine a best fit at multiple frequency points and wherein said field solver resistance inductive calculation provides multiple RL extraction results for each frequency as frequency dependent RL parameters;

caching and reusing said synthesized circuits based on calculations using said frequency dependent RL parameters as a method to reduce calculation duplication at extracted shapes when identical physical data for 2D cross-section shapes results from use of the scan line algorithm;

wherein frequency dependent RLC circuits for non-monotonic resistance frequency variation are synthesized by approximating a complex impedance function by a ration of polynomials as representative stable circuits; and wherein circuit netlisting procedures includes the circuit synthesis results as pair-wise coupling interactions; and wherein circuit netlisting procedures include the management of return path nodes of circuit synthesis results and referencing between input/output nodes of pair-wise coupling interactions and finding a set of poles and residues using resistance and inductance information using only real poles in a portion of a complex plane and in which the circuit elements are realizable.

2. A method according to claim 1 wherein independently of said two dimensional approximation for parallel wiring of conductor shapes, a capacitance extraction is calculated.

3. A method according to claim 1 wherein an equivalent circuit synthesis calculation is executed for said frequency dependent RL parameters resulting from RL field solver calculation of conductor shapes extraction.

4. A method according to claim 1 wherein the scanline represents a user defined signal and flower radius and limits for minimum and maximum layer searches.

5. A method according to claim 1 wherein the scanline uses said field solver resistance inductive calculation of the return path radius as a function of a user defined percentage of signal wire resistance under evaluation.

* * * * *